United States Patent [19]

Lam et al.

[11] 4,216,374

[45] Aug. 5, 1980

[54] HYBRID SIGNATURE TEST METHOD AND APPARATUS

[75] Inventors: Tim Y. Lam, Sunnyvale; Barry M. Saper, Los Altos Hills, both of Calif.

[73] Assignee: John Fluke Mfg. Co., Inc., Mountlake Terrace, Wash.

[21] Appl. No.: 933,019

[22] Filed: Aug. 11, 1978

[51] Int. Cl.$^2$ ..................... G01R 31/26; G06F 11/00
[52] U.S. Cl. .................................. 371/27; 324/73 R
[58] Field of Search .................... 235/302; 324/73 R; 364/900

[56] References Cited

U.S. PATENT DOCUMENTS

| | | | |
|---|---|---|---|
| 3,924,181 | 12/1975 | Alderson | 235/302 |
| 3,976,864 | 8/1976 | Gordon et al. | 235/302 |
| 4,059,749 | 11/1977 | Feilchenfeld | 235/302 |
| 4,139,147 | 2/1979 | Franke | 235/302 |

OTHER PUBLICATIONS

Hayes, Generation of Optimal Transition Count Tests, IEEE Transactions on Computers, vol. C-27, No. 1, Jan. 1978, pp. 36-41.
Gordon and Nadig, Hexadecimal Signatures Identify Troublespots in Microprocessor Systems, Electronics, Mar. 3, 1977, pp. 89-96.

Primary Examiner—Charles E. Atkinson
Attorney, Agent, or Firm—Townsend and Townsend

[57] ABSTRACT

An apparatus and method for identifying faults in a digital logic circuit system combines the output of a feedback signature generator and a synchronous transition counter to provide a unique signature sensitive both to bit pattern timing and bit pattern sequence. A plurality of output signals of the circuit system produced in response to a preselected input signal pattern is processed synchronously through a feedback signature generator or feedback shift register network, such as a serial cyclic redundancy check (CRC) network, and a synchronous bit transition counting network. A preselected portion of the output of the bit transition counting network is combined with a preselected portion of the bits of the shift register network to obtain a pseudo-random characteristic output bit pattern, or signature, which is unique to the circuit system under test. The fault detecting capability approaches 100 percent with an imbedded indication of the input test pattern duration as verification.

10 Claims, 3 Drawing Figures

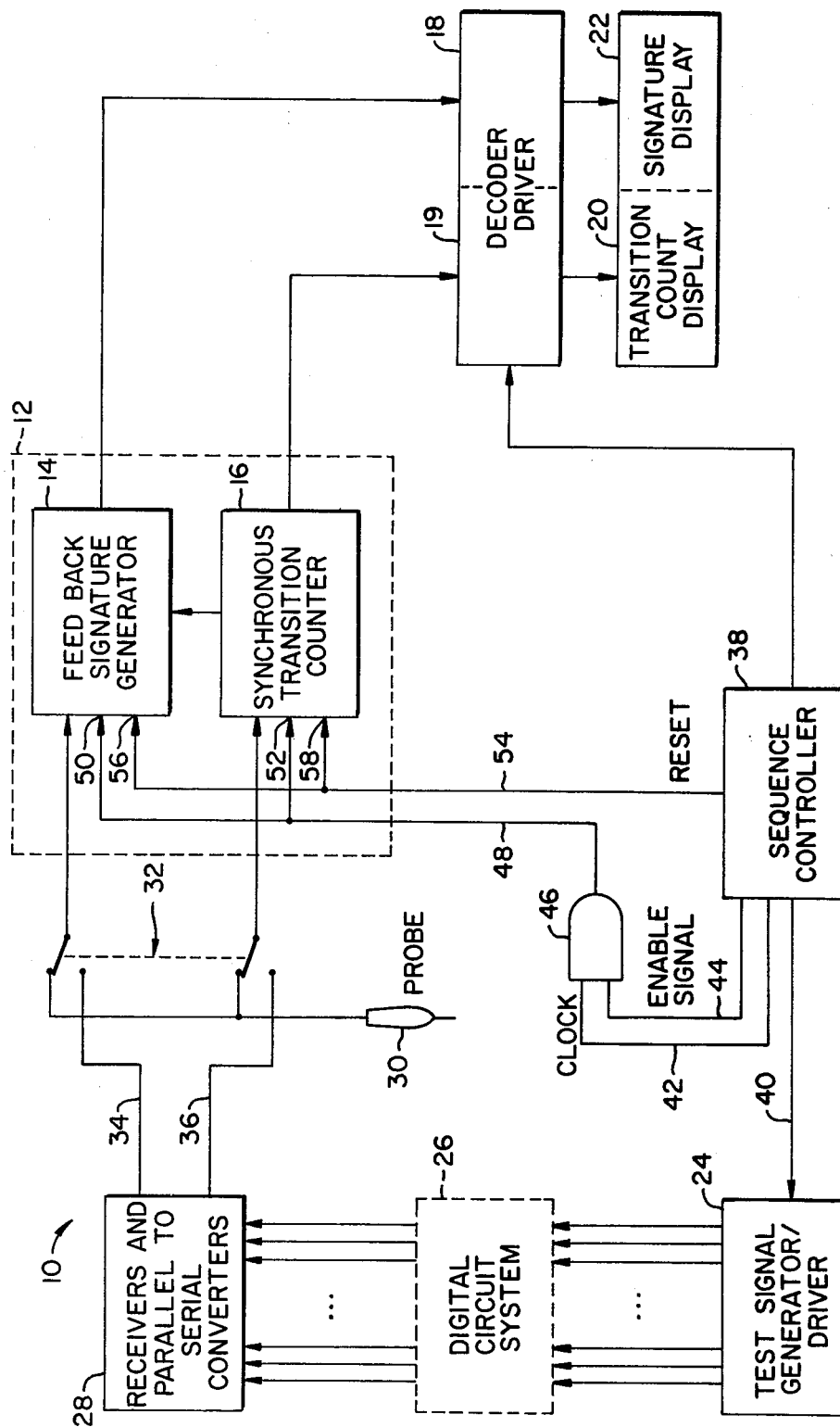
FIG._1.

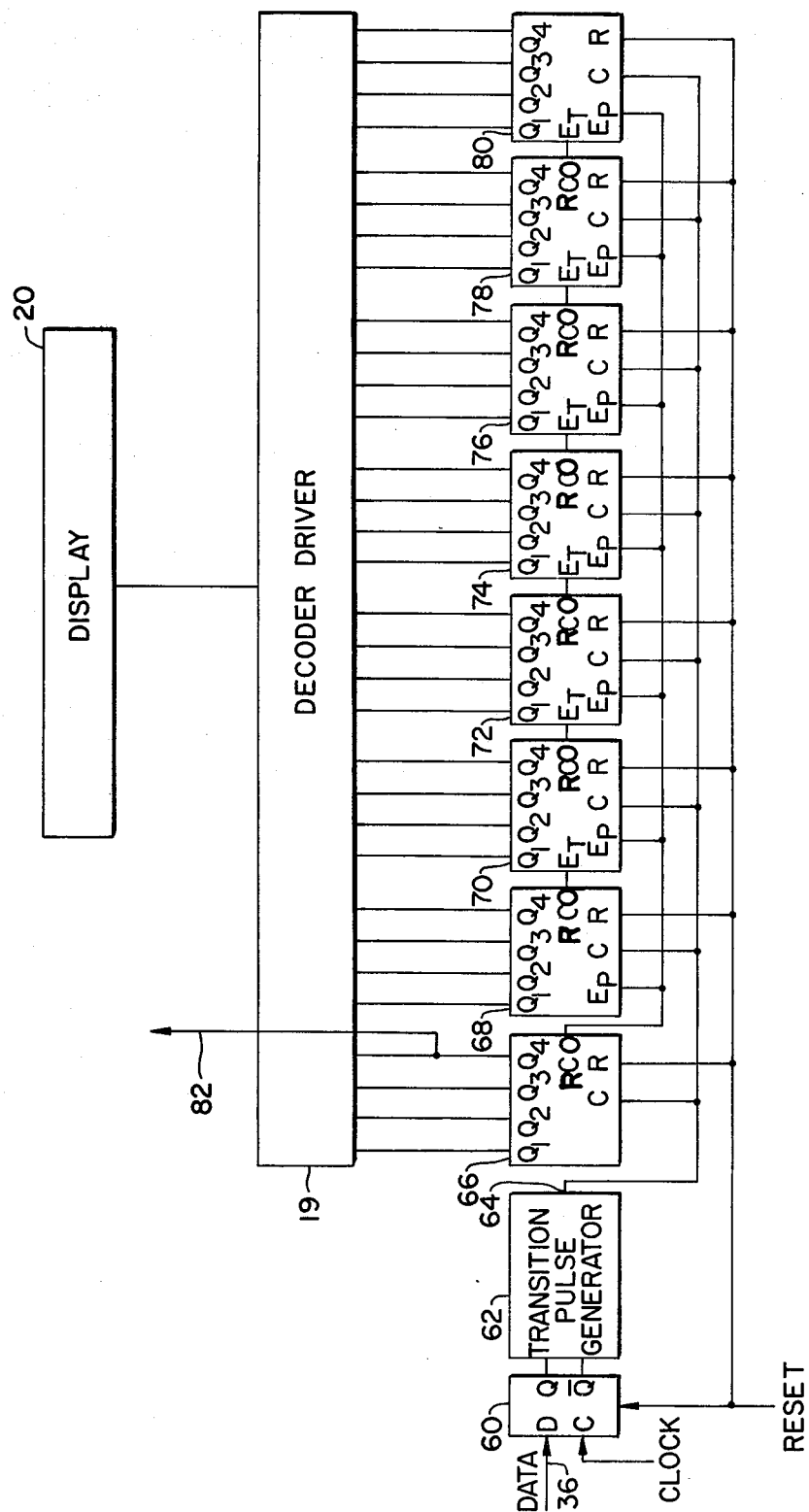
FIG._2.

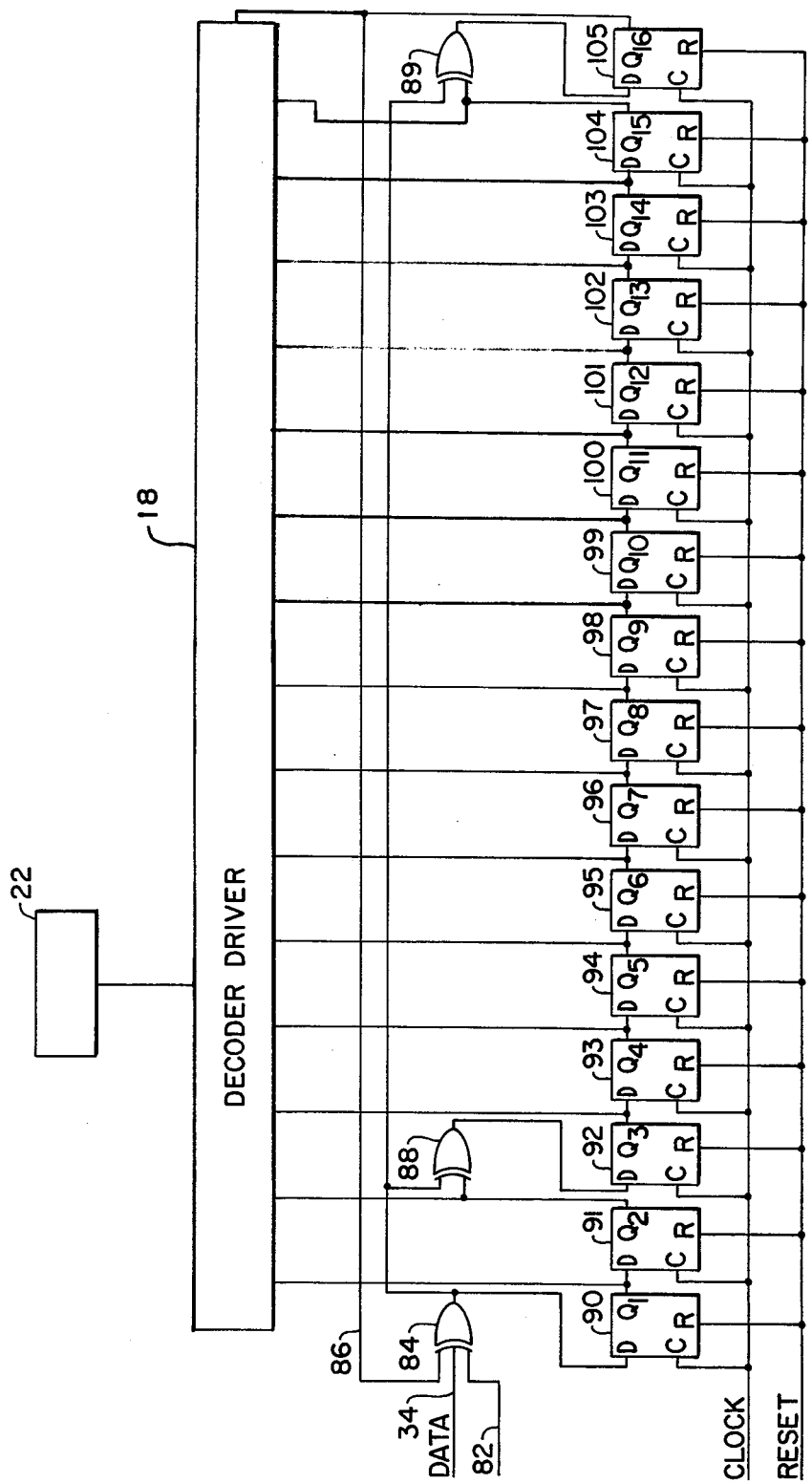
FIG._3.

HYBRID SIGNATURE TEST METHOD AND APPARATUS

BACKGROUND OF THE INVENTION

1. Field of Invention

This invention relates to digital logic test systems and more particularly to a system for rapidly and reliably identifying the existence of digital faults in a complex digital logic circuit system.

2. Description of the Prior Art

In the construction of printed circuit boards and other circuitry involving complex digital integrated circuits, faults occur due to poor connections, bad soldering and the like. Generally, complex digital logic circuitry is not accessible for testing purposes except at the terminals of the circuit board upon which the circuit system is mounted or at the terminals of the package in which the circuit system is encased. A great premium is placed on an ability to rapidly locate defects in logic circuitry and to reliably establish whether a particular system or unit under test is free of faults.

The diversity of types of individual circuit systems now available makes it generally impractical to provide dedicated devices for testing each particular type of circuit system. Therefore a number of general purpose methods and test devices have been developed for testing such circuit systems. For example, general purpose testers have been developed employing computer systems wherein a computer program is stored which simulates the operation of the digital logic under test for synchronous comparison therewith. These types of tests, although relatively reliable, are generally tedious to program and slow in operation.

Another type of test system developed is designed to compare directly the simultaneous response of a reference circuit system with the circuit system under test. This type of test system has major disadvantages. For example, a reference circuit system must be available, which is a major inconvenience in a field service environment, and the test system must be capable of connecting to two circuit systems simultaneously, which requires a second interface.

A third type of test system operates independently of the simultaneous response of a reference system. Such a tester operates according to what is generally known as the signature technique. According to this technique, a repeatable pseudo-random logic test pattern comprising the output of one or more bit pattern generators is provided to one or more of the input terminals of a circuit system to be tested. At the end of the test sequence, the response of the circuit system under test, a computed and coded signature word, is compared with the response of a reference, namely a reference signature word. The response may be displayed as a coded alpha-numeric pattern such as a combination of octal-numeric and alphabetic characters. The response of the system, the signature word, is documented for reference. The signature word of a known good circuit system is compared with the signature word of the circuit system under test. A discrepancy indicates the existence of faults in the circuit system under test.

Several types of signature systems are known to the art. One type is the transition count signature technique, in which logic level transitions of the output terminals or test point terminals of the circuit system under test is monitored for a fixed duration of test time. A representative device employing the transition counting technique hereinabove described is the Fluke Trendar Model 3020A Logictester manufactured by Fluke Trendar Corporation of Mountain View, California. The transition count technique, however, is limited in that faults due to timing problems and phase shift problems are not detected. For example, according to the transition count technique, the number of transitions at each terminal is counted. If one of the transitions is delayed relative to the transitions at another terminal, but the number of counts is unchanged, the fault goes undetected. Nevertheless, the transition count technique is valuable because it allows the test operator to determine the number of counts by which the circuit system under test differs from the reference signature, thereby obtaining an estimate of the severity of the error.

A further technique for testing digital circuit systems is the feedback signature method employed in a feedback shift register network. The most widely known feedback shift register technique is the cyclic redundancy check (CRC) technique developed for verifying the accuracy of digital communication. A description of representative cyclic redundancy check networks for testing digital circuits are found in U.S. Pat. No. 3,976,864, assigned to Hewlett-Packard Company of Palo Alto, California and U.S. Pat. No. 3,924,181, assigned to Hughes Aircraft Company, Culver City, California. A cyclic redundancy check network is capable of detecting timing and phase shift problems in a digital system. A mathematically pure implementation of the cyclic redundancy check technique has precisely definable fault detecting capabilities. Unfortunately, the resultant signature contains no indication of the degree of error detected or even of the length of the test pattern process. Consequently the operator is not given a "feel" for the severity of error encountered in the tested system, as can be obtained from the transition count technique.

SUMMARY OF THE INVENTION

According to the invention, an apparatus and method for identifying faults in a digital logic circuit system combines the output of a feedback signature generator and synchronous transition counter to provide a unique signature sensitive to both bit pattern timing and bit pattern sequence. In operation, a plurality of output signals of the circuit system under test produced in response to a preselected input signal pattern is processed in parallel through a feedback signature generator and synchronous bit transition counting network. A selected portion of the output of the bit transition counting network is provided to the feedback loop of the feedback signature generator to obtain a pseudo-random characteristic output bit pattern, or signature, unique to the circuit system under test.

The output bit pattern of the synchronous transition counter may be displayed as a numeric code, and the output of the feedback signature generator may be displayed as an alphabetic code appended to the numeric code to provide a signature according to the invention.

The feedback signature generator may be a serial shift register network from which output indications are extracted in parallel from the output terminals of selected one of the serially arranged shift register; a serial feedback loop; and adders, such as EXCLUSIVE OR gates, for combining feedback signals with data input signals and output signals from the synchronous transition counter.

The synchronous transition counter may comprise a plurality of counters having outputs coupled in parallel to count the number of digital transitions occurring at an input. A preselected output bit terminal of relatively low significance is connected to a preselected feedback shift register input of the feedback signature generator.

It is an object of the invention to combine advantageous features of the feedback signature generator and the synchronous transition counter to provide a more reliable indication of a faulty digital circuit system under test.

It is a further object of this invention to provide an output indication of fault having the high fault detecting probability of a feedback signature generator and the capability of indicating the severity of the detected fault of a transition counting network.

Other objects and advantages will be apparent from the following detailed description of preferred embodiments taken in conjunction with the drawings.

BRIEF DESCRIPTION OF THE DRAWINGS

FIG. 1 is a block diagram of a tester according to the invention.

FIG. 2 is a block diagram of a synchronous transition counting network portion of the invention.

FIG. 3 is a block diagram of a feedback signature generator of the invention.

DETAILED DESCRIPTION OF PREFERRED EMBODIMENTS

FIG. 1 shows a simplified block diagram of the test apparatus 10 employing a hybrid signature generator 12 according to the invention. The hybrid signature generator 12 comprises a feedback signature generator 14 and synchronous transition counter 16, discussed in further detail hereinafter. The feedback signature generator 14 and synchronous transition counter 16 each have an output coupled to decoder drivers 18, 19 which are operative to convert the output signals thereof into a form for useable display or other output. In particular, the decoder driver 19 driven by the transition counter 16 output is coupled to a transition count display 20. The decoder driver 18 driven by the feedback signature generator 14 is coupled to a signature display 22. The transition count display 20 is adapted to exhibit numeric output whereas the signature display 22 is adapted to provide an alphabetic output. As an example, the feedback signature generator portion of decoder driver 18 may generate the sixteen sequential alphabetic symbols A through P in response to the four-bit binary input of 0000 through 1111. Other encoding schemes may also be used, such as octal and BCD for the transition count display 20.

The test apparatus 10 further comprises a test signal generator/driver 24 which is adapted to produce preselected pseudo-random or programmed input signal test patterns at terminals adapted to couple to a digital circuit system 26 which is to be tested. The digital circuit system 26 reacts to the input test patterns to produce an output digital bit stream which is provided to an interface 28. The interface 28 comprises receivers and parallel-to-serial signal converters, the details of which are unimportant to the present invention. The interface 28 produces two digital output bit streams, which are adapted to be connected via signal lines 34 and 36 to the input terminals of the feedback signature generator 14 and to the synchronous transition counter 16, respectively. A probe 30 coupled to a double pole double throw switch 32 in the output signal lines 34, 36 is provided in order to bypass the interface 28. Using the probe 30 an operator can couple the hybrid signature generator 12 directly to a preselected location on the digital circuit system 26 to be tested for use in isolating localized faults.

A sequence controller 38 provides overall supervision for the test apparatus 10. The sequence controller 38 is coupled via a first control line 40 to the signal generator/driver 24 to select and synchronize the test pattern. A clock signal output line 42 and an enable signal output line 44 are coupled through a gate 46 via a synchronizing clock signal line 48 to the clock input terminals 50 and 52 of the feedback signature generator 14, and synchronous transition counter 16, respectively, to insure synchronous clock operation. Finally, a reset signal line 54 is coupled to reset input terminals 56, 58 of the feedback signature generator 14 and synchronous transition counter 16, respectively.

Turning now to FIG. 2, there is shown an embodiment of the synchronous transition counter 16 according to the invention. The synchronous transition counter 16 comprises a shift register 60, a pulse generator 62 and an array of counters 66, 68, 70, 72, 74, 76, 78 and 80. The shift register 60 is a D-type flip-flop adapted to receive data input from data line 36 (of FIG. 1) and having its complementary outputs coupled to the transition pulse generator 62. The transition pulse generator 62 is a simple pulse circuit which is adapted to produce a pulse upon a change of state of the shift register 60. The output 64 of transition pulse generator 62 is coupled in parallel to counters 66, 68, 70, 72, 74, 76, 78 and 80, which are coupled in series through a ripple carry output (RCO) as shown in FIG. 2. The counters may be 4-bit output decade counters or the like, such as a type 74160 coupled to carry forward.

The output terminals of each of the counters are coupled in parallel to the decoder driver 19 (FIG. 1) and hence to the transition count display 20 (FIG. 1).

A preselected bit, such as the fourth bit signal line 82, is coupled to the feedback signature generator, as shown in FIG. 3.

In FIG. 3, the feedback signature generator 14 is illustrated. The feedback signature generator 14 has as an input a three terminal EXCLUSIVE OR gate 84 to which is coupled the data input signal line, such as signal line 34, the transition counter input signal line 82 (FIG. 2) and a feedback signal line 86.

The feedback signature generator comprises a series of shift registers, such as sixteen serially coupled D-type flip-flops 90–105. Each flip-flop is coupled to a common clock line and a common reset line. The input or D terminal is coupled to the output or Q terminal of the previous flip-flop. The last output terminal, that of flip-flop 105, is coupled in feedback through feedback line 86 to the input of the first flip-flop 90, third flip-flop 92 and last flip-flop 105 through the EXCLUSIVE OR gate 84, an EXCLUSIVE OR gate 88, and an EXCLUSIVE OR gate 89. Although no particular feedback pattern is dictated, a conventional serial cyclic redundancy check network may be employed, such as the CRC-16 implementation. (See, for example, *Computer Design*, September 1975, p. 87.)

The outputs of the flip-flops 90–105 are coupled to the decoder driver 18 (FIG. 1) which converts the bits to a four-digit alphabetic output provided to signature display 22. The apparatus of FIG. 1, and particularly as disclosed in FIG. 2 and FIG. 3, operates as follows to generate a digital test signature word having a predetermined length for use in testing a digital electronic circuit system: The test signal generator/driver 24 provides a preselected digital bit pattern to the digital circuit system 26 to be tested, which in turn produces an output pattern of bits which are provided at output terminals to the interface 28. Alternatively, the probe 30 monitors the selected terminal or test point. The signal of the interface is fed via signal lines 34 and 36 to the feedback signature generator 14 and the synchronous transition counter 16. The synchronous transition counter 16 tallies the number of transitions of each output pattern of bits to produce at least one transition count and a first portion of the signature word.

The feedback signature generator 14 combines a selected plurality of the output pattern of bits with preselected other ones of the output pattern of bits and with at least one preselected bit derived from the synchronous transition counter 16 to produce a second portion of the signature word.

The first portion of the signature word may be numerically encoded, and the second portion of the signature word may be alphabetically encoded. The feedback signature generator 14 and the synchronous transition counter 16 are synchronized by the clock 46 so that the combining processing of the feedback signature generator 14 is synchronous with the transition counter 16.

In a specific embodiment, the feedback signature generator 14 sequentially combines the bits of the selected plurality of bits received via signal line 34 with the bits resulting from the combination of preceding ones of said bits. Hence comes the designation feedback signature generator. Referring to FIG. 3, the combining step comprises sequentially shifting each bit of the output pattern of bits through the sequential shift register elements and combining the output bits of preselected ones of the shift register elements with a current subtotal of the transition count, via signal line 82 and with the input bits to the shift register via the data line 34.

The digital circuit system 26 (FIG. 1) is tested by generating the signature word for the system under test according to the preceding technique and comparing that signature word with a signature word generated by a known good circuit system to determine whether or not there is a difference between the signature words. If there is no difference, then there is a high probability that the system functions properly. A difference indicates that the system is faulty. The extent of the fault is roughly indicated by the extent of difference between the numeric transition count portion of the signature words.

The invention has now been explained with reference to particular embodiments. Other embodiments will be apparent to those of ordinary skill in this art in light of this disclosure. Therefore it is not intended that the invention be limited except as indicated by the appended claims.

I claim:

1. A method for generating a digital test signature word having a predetermined length for use in testing a digital electronic circuit system wherein the circuit system is stimulated by a preselected pattern of bits of a digital signal to produce an output pattern of bits at a preselected location of said circuit system, said generating method comprising the steps of:

tallying the number of transitions of said output pattern of bits to produce at least one transition count defining a first portion of said signature word; and
combining a selected plurality of said output pattern of bits with preselected other ones of said output pattern of bits to produce a second portion of said signature word.

2. A method according to claim 1 wherein said combining step further comprises combining said selected plurality of bits with at least one preselected bit of said transition count.

3. A method according to claim 2 wherein said combining step further comprises sequentially combining the bits of said selected plurality of bits with the bits resulting from the combination of preceding ones of said bits.

4. A method according to claim 2 further comprising the step of numerically encoding said first portion of said signature word and alphabetically encoding said second portion of said signature word.

5. A method for generating a digital test signature word having a predetermined length for use in testing a digital electronic circuit system wherein said circuit system is stimulated by a preselected pattern of bits of a digital signal to produce an output pattern of bits at a selected location of said circuit system, said method comprising the steps of:

tallying the number of transitions of said output pattern of bits to produce at least one transition count defining a first portion of said signature words; and
sequentially shifting each bit of said output pattern of bits through sequential shift register elements of a multi-element shift register and combining output bits of preselected one of said shift register elements with a preselected bit of said transition count and with input bits to said shift register.

6. A method for testing a digital electronic system comprising the steps of:

generating a first signature word of a known good system according to the method of claim 5;
generating a second signature word of a system to be tested according to the method of claim 5; and
comparing the first and second signature words and indicating whether or not a difference obtains.

7. An apparatus for generating a digital test signature word of predetermined length for use in testing a digital electronic circuit system, said apparatus comprising:

means for applying a predetermined bit pattern at input means of the circuit system under test to stimulate the circuit system;
input means for receiving a digital bit stream from a preselected location of said digital electronic circuit system;
clock means for delivering a sequence of clock pulses coincident with said digital bit stream;
means connected to said input means and said clock means for tallying the number of transitions of said bit stream of produce to first portion of said signature word;
means connected to said input means, said clock means and said tallying means for combining a selected plurality of bits of said bit stream with preselected other ones of said bits and with a selected bit of said tallying means to produce a second portion of said signature word;
means for synchronously starting and stopping said clock means, said tallying means and said combining means; and means coupled to said combining and said tallying means for indicating said signature word.

8. An apparatus according to claim 7 wherein said combining means further comprises means for sequentially combining the bits of said bit stream with bits resulting from the combination of preceding ones of said bits.

9. An apparatus according to claim 8 wherein said combining means further comprises a multi-element shift register having sequential shift register elements and means coupling preselected ones of said shift register outputs with preselected ones of said shift register inputs and with at least one bit of said tallying means.

10. An apparatus according to claim 7 wherein said indicating means comprises means for numerically encoding said first portion of said signature word and means for alphabetically encoding said second portion of said signature word.

* * * * *